United States Patent
Lu et al.

(10) Patent No.: US 10,430,923 B2
(45) Date of Patent: Oct. 1, 2019

(54) FLEXIBLE DISPLAY DEVICE

(71) Applicant: WUHAN TIANMA MICRO-ELECTRONICS CO., LTD., Wuhan (CN)

(72) Inventors: Jingru Lu, Shanghai (CN); Mingyan Huang, Xiamen (CN); Yanhua Liu, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 15/945,531

(22) Filed: Apr. 4, 2018

(65) Prior Publication Data

US 2018/0225804 A1 Aug. 9, 2018

(30) Foreign Application Priority Data

Nov. 30, 2017 (CN) .......................... 2017 1 1242229

(51) Int. Cl.
*G06T 3/40* (2006.01)
*H05K 5/00* (2006.01)
*H05K 5/02* (2006.01)
*H05K 1/02* (2006.01)
(Continued)

(52) U.S. Cl.
CPC ................ *G06T 3/40* (2013.01); *G09F 9/301* (2013.01); *H05K 1/028* (2013.01); *H05K 5/0017* (2013.01); *H05K 5/0217* (2013.01); *H05K 5/0239* (2013.01); *G06K 9/00006* (2013.01); *H05K 2201/10128* (2013.01); *H05K 2201/10151* (2013.01)

(58) Field of Classification Search
None
See application file for complete search history.

(56) References Cited

U.S. PATENT DOCUMENTS

2003/0144034 A1* 7/2003 Hack .................. H04M 1/0208
455/566
2005/0040962 A1* 2/2005 Funkhouser .......... G06F 1/1601
340/815.4
(Continued)

FOREIGN PATENT DOCUMENTS

CN 101163163 B 4/2008
CN 103069473 A 4/2013
(Continued)

*Primary Examiner* — Kee M Tung
*Assistant Examiner* — Patrick F Valdez
(74) *Attorney, Agent, or Firm* — Alston & Bird LLP

(57) ABSTRACT

Disclosed is a flexible display device. The flexible display device includes: a housing, a closure lid, a flexible display panel, an extension mechanism and a controller. A shaft is provided inside the housing. A sidewall of the housing is provided with an opening. The closure lid is opposite to the opening, and a surface of the closure lid facing away from the opening is provided with a user identity recognition module. The flexible display panel is wound onto the shaft and includes a first end and a second end opposite to the first end. The first end is connected to the shaft, and the second end is connected to the closure lid. The extension mechanism is configured to support the flexible display panel extending out of the housing.

15 Claims, 7 Drawing Sheets

(51) Int. Cl.
*G09F 9/30* (2006.01)
*G06K 9/00* (2006.01)

(56) References Cited

U.S. PATENT DOCUMENTS

| | | | | |
|---|---|---|---|---|
| 2015/0179728 A1* | 6/2015 | Kwon | ................. | H01L 27/3276 |
| | | | | 257/40 |
| 2016/0034000 A1* | 2/2016 | Lee | ....................... | G06F 1/1652 |
| | | | | 361/749 |
| 2016/0120023 A1* | 4/2016 | Choi | ...................... | H05K 1/028 |
| | | | | 361/749 |
| 2016/0307545 A1* | 10/2016 | Lee | .......................... | G09G 5/38 |
| 2017/0373124 A1* | 12/2017 | Yang | .................... | H01L 27/3246 |

FOREIGN PATENT DOCUMENTS

| | | | | | |
|---|---|---|---|---|---|
| CN | 106023813 | A | | 10/2016 | |
| CN | 20594584 | | * | 2/2017 | |
| CN | 106601131 | A | | 4/2017 | |
| CN | 107248376 | A | | 10/2017 | |
| GB | 2565879 | A | * | 2/2019 | ............... G02F 1/13 |

\* cited by examiner

10,430,923 B2

FLEXIBLE DISPLAY DEVICE

CROSS-REFERENCES TO RELATED APPLICATIONS

This application claims priority to Chinese patent application No. CN201711242229.6, filed on Nov. 30, 2017, the disclosure of which is incorporated herein by reference in its entirety.

TECHNICAL FIELD

Embodiments of the present disclosure relate to display technologies, and, in particular, relate to a flexible display device.

BACKGROUND

A reel-type flexible display device stores a flexible display panel in an accommodating portion, reducing the volume of the flexible display device and being convenient to carry and display, and hence has been attracting attention as a next-generation display.

The conventional reel-type flexible display device includes an accommodating portion and a flexible display panel mounted inside the housing. When an image needs to be displayed by the flexible display panel, the user has to manually pull the flexible display panel out of the housing, so that the flexible display panel can be out of the housing. Apparently, the existing reel-type flexible display device is inconvenient for its operation and has a poor user experience.

SUMMARY

Embodiments of the present disclosure provide a flexible display device so as to achieve the self-extension of the flexible display device and improve the user experience.

An embodiment of the present disclosure provides a flexible display device. The flexible display device includes a housing, a closure lid, a flexible display panel, an extension mechanism and a controller.

An interior of the housing is provided with a shaft, and a sidewall of the housing is provided with an opening.

The closure lid is configured to mate with the opening, and a surface of the closure lid facing away from the opening is provided with a user identity recognition module.

The flexible display panel is wound onto the shaft and includes a first end and a second end opposite to the first end. The first end is connected to the winding shaft, and the second end is connected to the closure lid. When the flexible display panel does not extend out of the housing, the closure lid is engaged in the opening and seals the opening, The extension mechanism includes a third end and a fourth end opposite to the third end. The third end is secured to the sidewall of the housing, and the fourth end is secured to the closure lid. The extension mechanism extends through the opening and is configured to support the flexible display panel when the flexible display panel extends out of the housing.

The controller is integrated to the sidewall of the housing and electrically connected to the user identity recognition module and the extension mechanism. The controller is configured to control the extension mechanism and the flexible display panel to extend out of the housing according to an identity recognition signal detected by the user identity recognition module.

DETAILED DESCRIPTION

The present disclosure will be further described in detail below with reference to the accompanying drawings and embodiments. It can be understood that the specific embodiments described herein are only used to explain the present disclosure rather than to limit the present disclosure. In addition, it should also be noted that, for the convenience of description, only some structures related to the present disclosure but not all structures are shown in the accompanying drawings.

Figure 1:
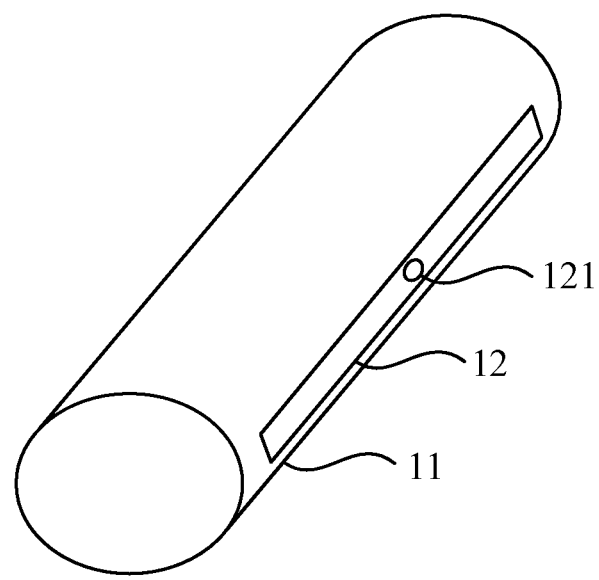
FIG. 1 is a schematic perspective structural view of a flexible display device according to an embodiment of the present disclosure.
Figure 2:
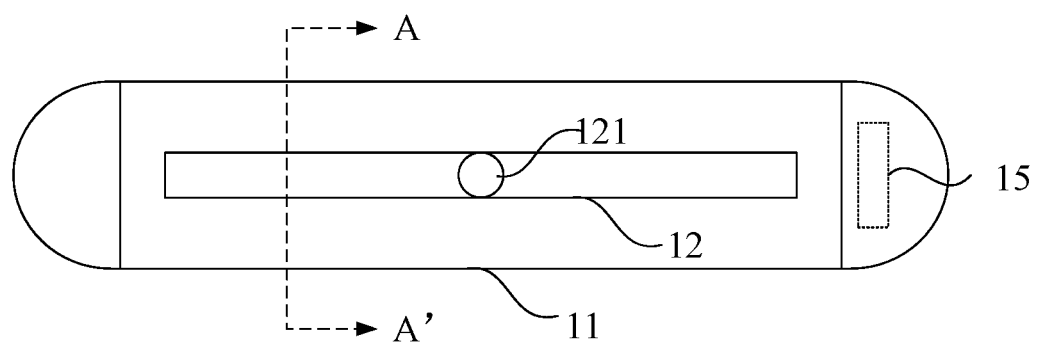
FIG. 2 is a schematic view from the right side of the flexible display device in FIG. 1.
Figure 3:
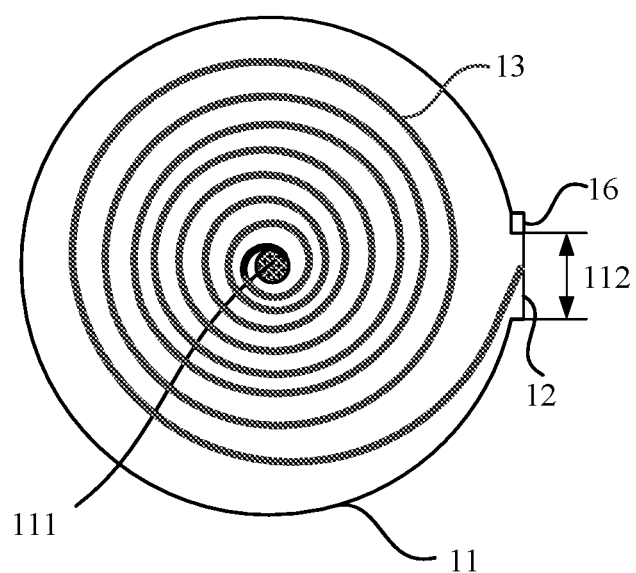
FIG. 3 is a schematic cross-sectional view taken along a cross section line AA' in FIG. 2.
Figure 4:
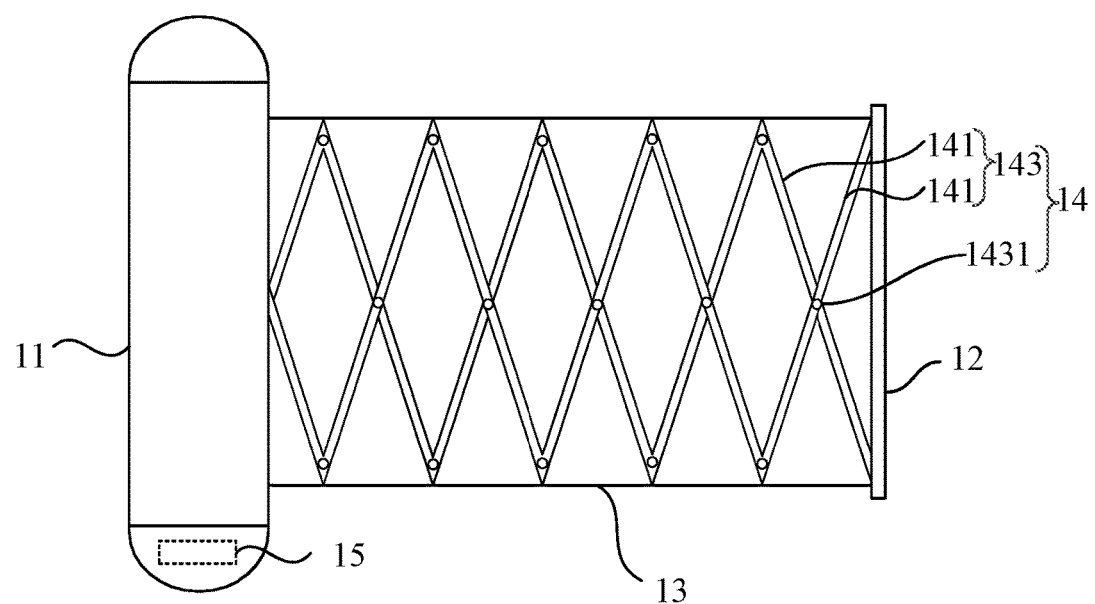
FIG. 4 is a schematic bottom view of the flexible display device in FIG. 1 in an opened state.

FIG. 1 is a schematic perspective structural view of a flexible display device according to an embodiment of the present disclosure. FIG. 2 is a schematic view from the right side of the flexible display device in FIG. 1. FIG. 3 is a schematic cross-sectional view taken along a cross section line AA' in FIG. 2. FIG. 4 is a schematic bottom structural view of the flexible display device in FIG. 1 in an opened state. As shown in FIG. 1 to FIG. 4, the flexible display device includes an housing 11, a closure lid 12, a flexible display panel 13, an extension mechanism 14 and a controller 15. A sidewall of the housing 11 is provided with an opening 112. The closure lid 12 is opposite to the opening 112. A surface of the closure lid 12 facing away from the opening 112 is provided with a user identity recognition module 121. An interior of the housing 11 is provided with a winding shaft 111. The flexible display panel 13 is wound onto the winding shaft 111, and includes a first end and a second end opposite to the first end. The first end is connected to the winding shaft 111, and the second end is connected to the closure lid 12. When the flexible display panel 13 does not extend out of the housing, the closure lid 12 is engaged in the opening 112 and seals the opening 112 (as shown in FIG. 3). The extension mechanism 14 is also secured to the sidewall of the housing 11, and includes a third end and a fourth end opposite to the third end. The third end is secured to the sidewall of the housing 11, and the fourth end is secured to the closure lid 12. The extension mechanism 14 extends through the opening 112 and is configured to support the flexible display panel 13 extending out of the housing 11. The controller 15 is integrated to the sidewall of the housing 11 and electrically connected to the user identity recognition module 121 and the extension mechanism 14. The controller 15 is configured to control the extension mechanism 14 and the flexible display panel 13 to extend out of the housing 11 according to an identity recognition signal detected by the user identity recognition module 121.

Continuing to refer to FIG. 1 to FIG. 4, when being used, the flexible display device recognizes the user identity by means of the user identity recognition module 121, and further determines the user's authority according to a recognition result of the user identity recognition module 121. If it is determined that the user has the right to use the flexible display device, the controller 15 actives the extension mechanism 14 and causes the extension mechanism 14 to extend, carrying the flexible display panel 13 out of the housing 11.

In the flexible display device provided by embodiments of the present disclosure, the controller and the extension mechanism are disposed inside the housing, and the extension mechanism includes the third end and the fourth end opposite to the third end, the third end is secured to the sidewall of the housing, the fourth end is secured to the closure lid. The extension mechanism extends through the opening and is configured to support the flexible display panel extending out of the housing. The controller is integrated to the sidewall of the housing and electrically connected to the user identity recognition module and the extension mechanism. The controller is configured to control the extension mechanism and the flexible display panel to extend out of the housing according to an identity recognition signal detected by the user identity recognition module. The problems of inconvenient operation and poor user experience since the user has to manually pull the flexible display panel out of the housing when displaying an image by an existing reel-type flexible display device are solved, thereby achieving the automatic extension of the flexible display panel and achieving the purpose of improving the user experience.

In addition, when the existing reel-type flexible display device is opened, the flexible display panel has problems such as falling and bending deformation due to thin thickness and light weight and poor rigidity performances, causing a rough display surface of the flexible display panel and poor image display effect. In consideration of the above problems, the extension mechanism provided by the present disclosure further has the function of supporting the flexible display panel extending through the housing, that is, the extension mechanism provides a rigid support for the flexible display panel, thereby solving the problem that when the existing reel-type flexible display device is opened, the image display effect is affected by the falling and bending deformation of the flexible display panel, and improving the display effect of the flexible display panel.

As shown in FIG. 3, optionally, the flexible display device may further include a displacement sensor 16. The displacement sensor 16 is integrated to the sidewall of the housing 11 and configured to detect a relative displacement of the flexible display panel 13. The controller 15 is electrically connected to the displacement sensor 16 and configured to determine a length of the flexible display panel 13 extending out of the housing 11 and an extended length of the extension mechanism 14 according to the relative displacement of the flexible display panel 13. Such configuration has an advantage that the controller 15 can determine the next operation on the flexible display panel 13 based on the length of the flexible display panel 13 extending out of the housing 11 and the extended length of the extension mechanism 14.

In the above technical solution, the displacement sensor 16 may be a potentiometer type displacement sensor, an inductance type displacement sensor, a selsyn, a capacitance type displacement sensor, an eddy-current type displacement sensor, a hall type displacement sensor and the like, and the type of the displacement sensor 16 is not limited by the present disclosure. In addition, in FIG. 3, the displacement sensor 16 is exemplarily disposed close to the opening 122, which is merely a specific example of the present disclosure rather than a limitation to the present disclosure. When being specifically disposed, the displacement sensor 16 may be disposed at any position of the sidewall of the housing 11.

Typically, the controller 15 is configured to determine a size of an image when the image is displayed by the flexible display panel 13. Specifically, in actual use, the controller 15 calculates a length and a width of a display region for displaying images of the flexible display panel 13 which has extended to the outside of the housing 11 according to the length of the flexible display panel 13 extending out of the housing 11, and adjusts the resolution of the image to be displayed according to the length and width of the image to be displayed, such that the image to be displayed can be completely represented on the flexible display panel 13. By such configuration, the image to be displayed is displayed only by the part of the flexible display panel 13 outside of the housing 11, thereby ensuring the integrity of the image to be displayed, and being in line with the environmental requirements of green conservation.

Figure 5:
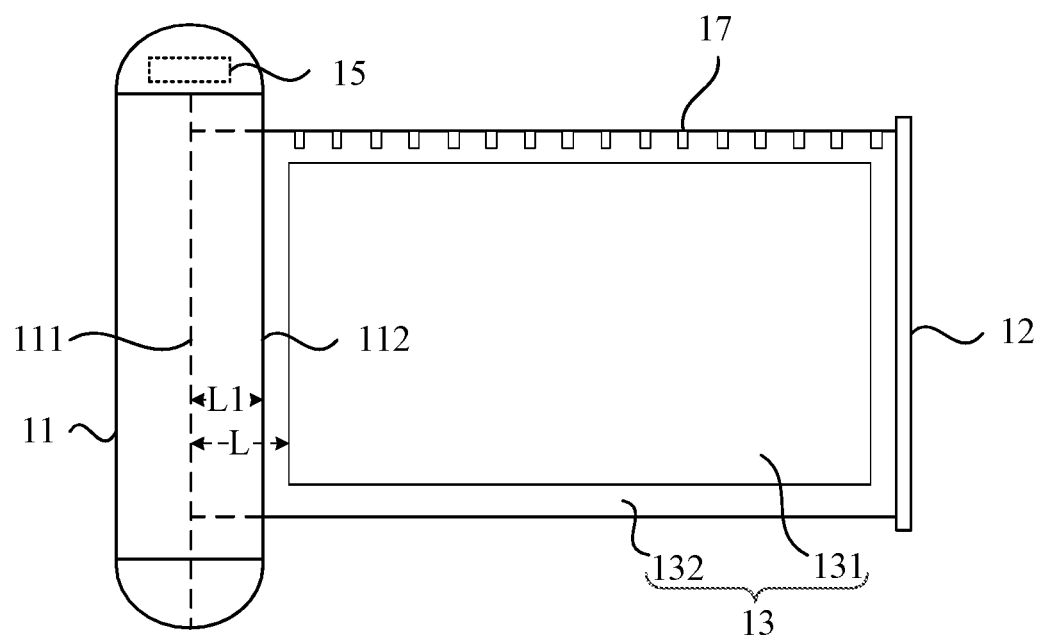
FIG. 5 is a schematic top view of a flexible display device in an opened state according to an embodiment of the present disclosure.

FIG. 5 is a schematic top structural view of a flexible display device in an opened state according to an embodiment of the present disclosure. As shown in FIG. 5, optionally, the flexible display panel is further provided with position marks 17. The displacement sensor 16 (not shown in FIG. 5) determines the length of the flexible display panel 13 extending out of the housing 11 and the extended length of the extension mechanism 14 by means of the position marks 17. An advantage of such configuration is that the displacement sensor 16 can accurately calculate the length of the flexible display panel 13 extending out of the housing 11 and the extended length of the extension mechanism 14.

It should be noted that, as shown in FIG. 5, the flexible display panel 13 includes a display region 131 and a non-display region 132 surrounding the display region 131. These position marks 17 are arranged in the non-display region 132 of the flexible display panel 13, which is only a specific example of the present disclosure rather than a limit to the present disclosure. Optionally, these position marks may are arranged on a surface of the flexible display panel 13 opposite to the surface for displaying images.

Further, after the user activates the extension mechanism 14 to extend out of the housing 11 through the identity authentication by means of the identity recognition module 121, there may be many methods for control the extension mechanism to stop extending so as to control the extended length of the flexible display panel 13. For example, when it is detected that the flexible display panel 13 has extended by a predetermined length, the controller 15 controls the extension mechanism 14 to stop extending. Alternatively, when receiving an extension stop instruction, the controller 15 controls the extension mechanism 14 to stop extending. The extension stop instruction may be an identity recognition signal detected again by the user identity recognition module 121 or other signals.

Continuing to refer to FIG. 5, in order to ensure that the display region 131 of the flexible display panel 13 can be completely spread out when the flexible display panel 13 is in a complete opened state, and to ensure no waste of the effective displaying area of the flexible display panel 13, optionally, the flexible display panel 13 includes the display region 131 and the non-display region 132 surrounding the display region 131, a distance L between the first end of the flexible display panel 13 and a closest one of boundary lines between the display region 131 and the non-display region 132 should be greater than a distance L1 between the winding shaft 111 and the opening 112, such that the display region 131 can completely extend out of the housing 11 and display images when the flexible display panel 13 is completely opened.

Optionally, the extension mechanism of the flexible display device includes a driving portion, a transmission portion and a support structure. The controller is connected to the driving portion and the transmission portion. The driving portion drives, under the control of the controller, the transmission portion to perform transmission. The transmission portion is connected to the support structure so as to drive the support structure to extend or retract.

There are many specific configurations for the driving portion, the transmission portion and the support structure in the actual setting. The following describes typical examples in detail but does not limit the present disclosure.

Figure 6:
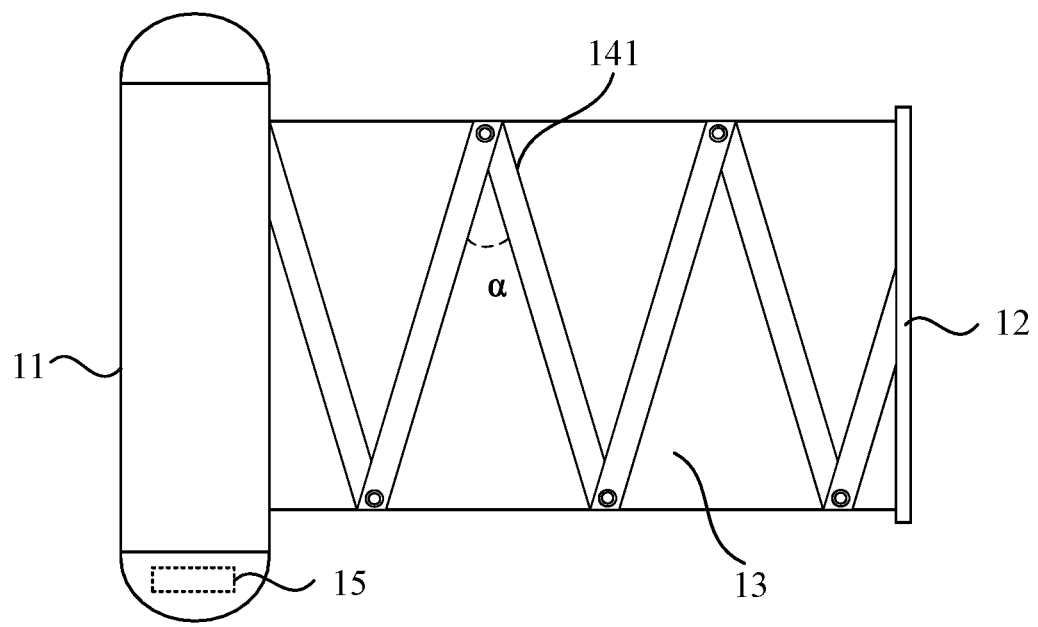
FIG. 6 is a schematic bottom view of another flexible display device in an opened state according to an embodiment of the present disclosure.

FIG. 6 is a schematic structural view of another flexible display device according to an embodiment of the present disclosure. As shown in FIG. 6, the support structure includes at least one support frame. The support frame includes a plurality of support rods 141 which are connected end to end, and two adjacent ones of the plurality of support rods 141 are hinged with each other. When the support frame extends, an included angle between the extending directions of the two adjacent support rods 141 increases gradually. When the support frame retracts, the included angle between the extending directions of the two adjacent support rods 141 decreases gradually. Such configuration has a simple structure and is easy to fabricate, and can support the flexible display panel 13 protruding out of the housing 11, thereby solving the problem that when the existing reel-type flexible display device is opened, the image display effect is affected by the falling and bending deformation of the flexible display panel, and improving the display effect of the flexible display panel.

FIG. 6 exemplarily illustrates a configuration in which the support structure includes only one support frame and the support frame is in a zigzag shape, this configuration is just a specific example of the present disclosure rather than a limit to the present disclosure. Continuing to refer to FIG. 4, the support structure 14 includes two support frames, the support frame is in a zigzag shape, an overlapping region of the two adjacent support frames is provided with a first rotation shaft 1431, and the support rod passing through the first rotation shaft 1431 is sleeved on the first rotation shaft 1431, such that the support structure 14 not only can effectively extend and retract, but also has an improved stability, making the flexible display panel 13 supported by the support structure 14 more stable.

Figure 7:
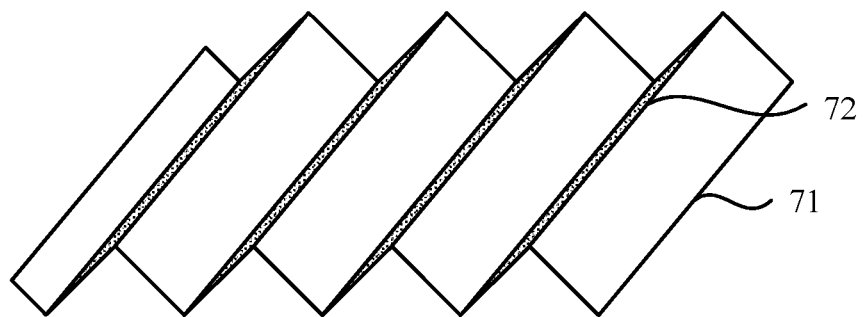
FIG. 7 is a schematic structural view of a support structure according to an embodiment of the present disclosure.

FIG. 7 is a schematic structural view of another support structure according to an embodiment of the present disclosure. As shown in FIG. 7, the support structure is an origami folded shape with valley lines 71 and mountain lines 72 alternately arranged, and the valley lines 71 and mountain lines 72 are parallel to each other. Such configuration has a simple structure and is easy to fabricate, and can support the flexible display panel protruding out of the housing, thereby solving the problem that when the existing reel-type flexible display device is opened, the image display effect is affected by the falling and bending deformation of the flexible display panel, and improving the display effect of the flexible display panel.

Figure 8:
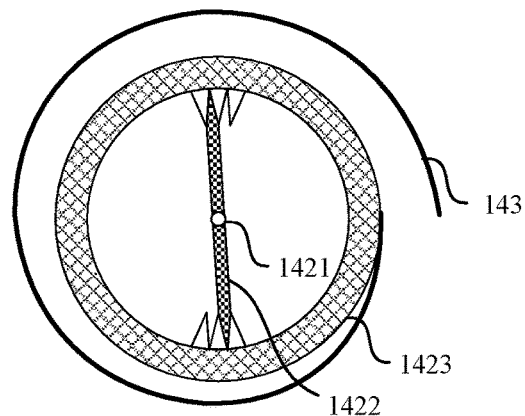
FIG. 8 is a schematic structural view of an extension net in another support structure according to an embodiment of the present disclosure.

FIG. 8 is a schematic structural view of an extension mechanism in another support structure according to an embodiment of the present disclosure. The driving portion includes a motor (not shown in FIG. 8). The transmission portion includes a drum 1423 and a second rotation shaft 1421. The motor is connected to the second rotation shaft 1421. The second rotation shaft 1421 is disposed at an axis of the drum 1423 and is secured to the drum 1423. The support structure 143 is wound on an external surface of the drum 1423 to control the second rotation shaft 1421 to rotate around an axis thereof, such that the support structure 143 is driven to extend or retract.

In operating, the controller 15 controls the operation of the motor. The motor drives the second rotation shaft 1421 to rotate about its axis, thereby driving the drum 1423 to rotate about the axis of the second rotating shaft 1421. With the rotation of the drum 1423, the support structure 143 gradually extends outwards or retracts toward the housing 11. As shown in FIG. 8, if the second rotation shaft 1421 rotates clockwise, the drum 1423 is driven to rotate clockwise, and the support structure 143 gradually extends outwards. If the second rotation shaft 1421 rotates counterclockwise, the drum 1423 is driven to rotate counterclockwise, and the support structure 143 gradually retracts toward the housing.

In actual arrangement, the drum 1423 and the second rotation shaft 1421 may be fixedly connected. Alternatively, as shown in FIG. 8, the transmission portion may further include a transmission rod 1422 fixedly connected to the second rotation shaft 1421, and the transmission rod 1422 is engaged with the drum 1423 like gears.

It should be noted that, the support structure 143 herein may be made of a hard material with good ductility, for example, a material such as a shape memory alloy. The shape memory alloys (SMA) is a kind of alloying material capable of completely eliminating its deformation formed at a lower temperature when being heated and recovering its original shape before deformation, that is, the alloy has a "memory" effect. Optionally, at a low temperature, as shown in FIG. 8, the support structure 143 made of shape memory alloy is curled and wound on the drum 1423. At a high temperature, as shown in FIG. 4, the support structure 143 made of shape memory alloy is in a straight state for carrying the flexible display panel 13 extending from the housing. The driving portion further includes a heating device connected with the support structure 143 made of shape memory alloy for directly heating the support structure 143. Alternatively, the heating device is connected to the drum 1423 for directly heating the drum 1423, and the drum 1423 transfers the heat to the support structure 143 through heat transmission.

In addition, the drum 1423 of the support structure 143 may be shared with the winding shaft 111 of the housing 11, or the drum 1423 and the winding shaft 111 may be provided separately. Arranging the drum 1423 and the winding shaft 111 separately can prevent the flexible display panel from being worn by the extension mechanism in the winding process of the extension mechanism and the flexible display panel, thereby increasing the service life of the flexible display panel.

Figure 9:
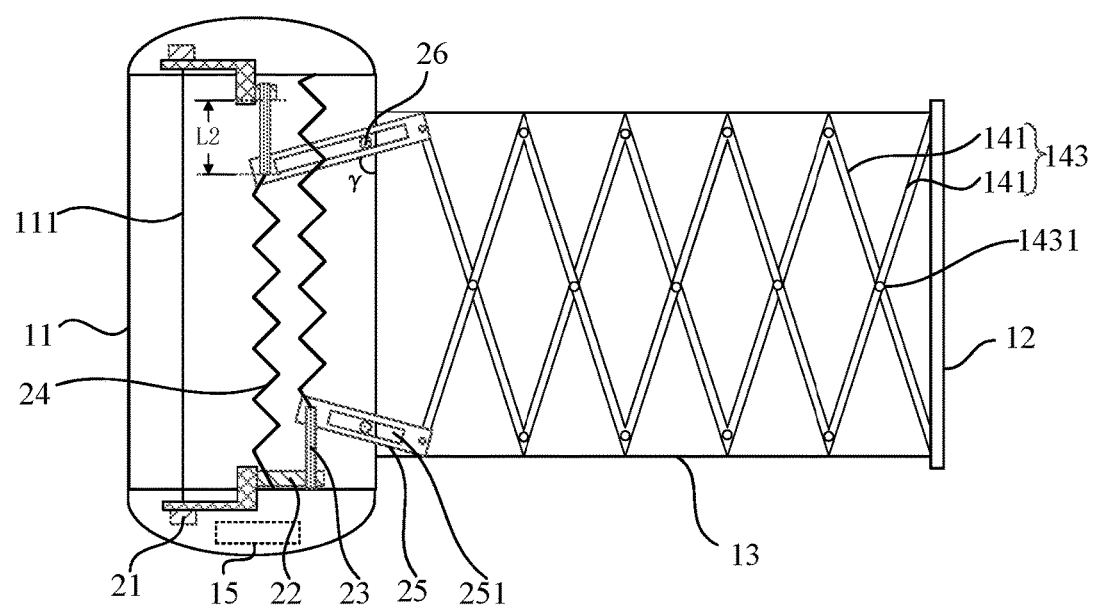
FIG. 9 is a schematic bottom view of another flexible display device in an opened state according to an embodiment of the present disclosure.

FIG. 9 is a schematic bottom structural view of another flexible display device in an opened state according to an embodiment of the present disclosure. The driving portion includes a motor 21. The transmission portion includes a third rotation shaft 22, a belt 23, a spring 24 and a transmission rod 25. The motor 21 is connected to the third rotation shaft 22 and is configured to control the third rotation shaft 22 to rotate. The belt 23 is wound on the third rotation shaft 22. The belt 23 includes a seventh end and an eighth end opposite to the seventh end. The spring 24 includes a ninth end and a tenth end opposite to the ninth end. The seventh end of the belt 23 is connected to the third rotation shaft 22, and the eighth end of the belt 23 is connected to the ninth end of the spring 24. The tenth end of the spring 24 is secured to the inner sidewall of the housing 11, and the spring 24 is in a stretched state. The transmission rod 25 includes an eleventh end and a twelfth end opposite the eleventh end. The eleventh end of the transmission rod 25 is rotatable connected to the eighth end of the belt 23. The twelfth end of the transmission rod 25 is rotatable connected to the support structure 143. The transmission rod 25 is provided with a groove 251 running through the transmission rod 25. A securing column 26 is provided inside the housing 11. The securing column 26 passes through the groove 251 and is configured to define a movable range of the transmission rod 25.

When the flexible display panel 13 needs to be controlled to extend out of the housing 11, the controller 15 controls the motor 21 to operate, the motor 21 drives the third rotation shaft 22 to rotate about its axis, such that the number of turns of the belt 23 wound around the third rotation shaft 22 increases, the a length L2 of the part of belt 23 not wound around the third rotation shaft 22 is reduced, an included angle y between the transmission rod 25 and the inner sidewall of the housing 11 increases, the support structure 143 is driven to gradually extend outwards, and then the second end of the flexible display panel 13 is driven to extend out of the housing 11 and move in a direction away from the housing 11.

When the flexible display panel 13 needs to be received in the housing 11, the controller 15 controls the motor 21 to operate, the motor 21 drives the third rotation shaft 22 to rotate about its axis, such that the number of turns of the belt 23 wound around the third rotation shaft 22 is reduced, the length L2 of the part of belt 23 not wound around the third rotation shaft 22 increases, the included angle y between the transmission rod 25 and the inner sidewall of the housing 11 is reduced, the support structure 143 is driven to gradually retract to the housing 11, and then the flexible display panel 13 is driven to retract to the housing 11.

Further, as shown in FIG. 9, the motor 21 may be arranged to be connected to the winding shaft 111 and be configured to control the winding shaft 111 to rotate so as to cause the winding shaft 111 to cooperate with the support structure 143 for achieving the objectives of driving the flexible display panel 13 to extend out of the housing 11 or receiving the flexible display panel 13 into the housing 11.

Based on the above technical solutions, optionally, the flexible display device further includes a flexible printed circuit (not shown in the figure). The flexible printed circuit is disposed at a side of the extension mechanism facing away from the flexible display panel. The flexible printed circuit includes a fifth end and a sixth end opposite to the fifth end. The fifth end of the flexible printed circuit is electrically connected to the user identity recognition module, and the sixth end of the flexible printed circuit is electrically connected to the controller. The user identity recognition module and the controller are electrically connected by the flexible printed circuit. On the one hand, the signal transmission between the user identity recognition module and the controller is realized, on the other hand, due to the flexible nature of the flexible printed circuit, the wires in the flexible printed circuit will not be damaged during the extension or retraction of the extension mechanism. Therefore, the service life of the flexible display device is prolonged.

Figure 10:
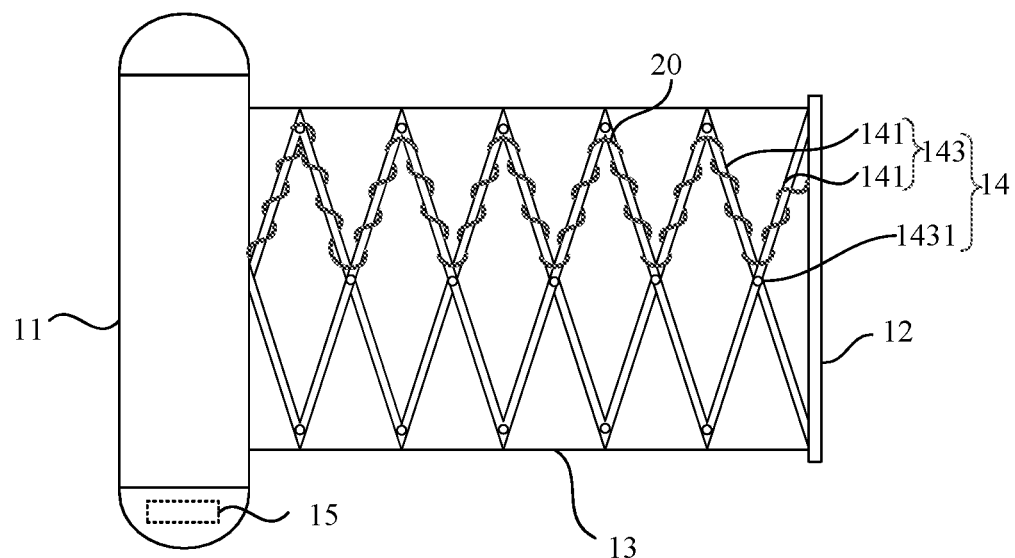
FIG. 10 is a schematic bottom view of another flexible display device in an opened state according to an embodiment of the present disclosure.

There are many ways to specifically arrange the flexible printed circuit, which may be determined according to the specific conditions of the support structure during specific arrangements. FIG. 10 is a schematic structural bottom view of another flexible display device in an opened state according to an embodiment of the present disclosure. Exemplarily, as show in FIG. 10, the support structure 143 includes at least one support frame. The support frame includes a plurality of support rods 141 which are connected end to end, and two adjacent ones of the plurality of support rods 141 are hinged with each other. The flexible wire board 20 is wound around each support rods 141 of the support structure 143 like a vine.

Optionally, the user identity recognition module includes at least one of a face recognition module, an iris recognition module and a fingerprint recognition module. The principle of user identity recognition will be described in detail below by using an example in which the user identity recognition module is the fingerprint recognition module.

Figure 11:
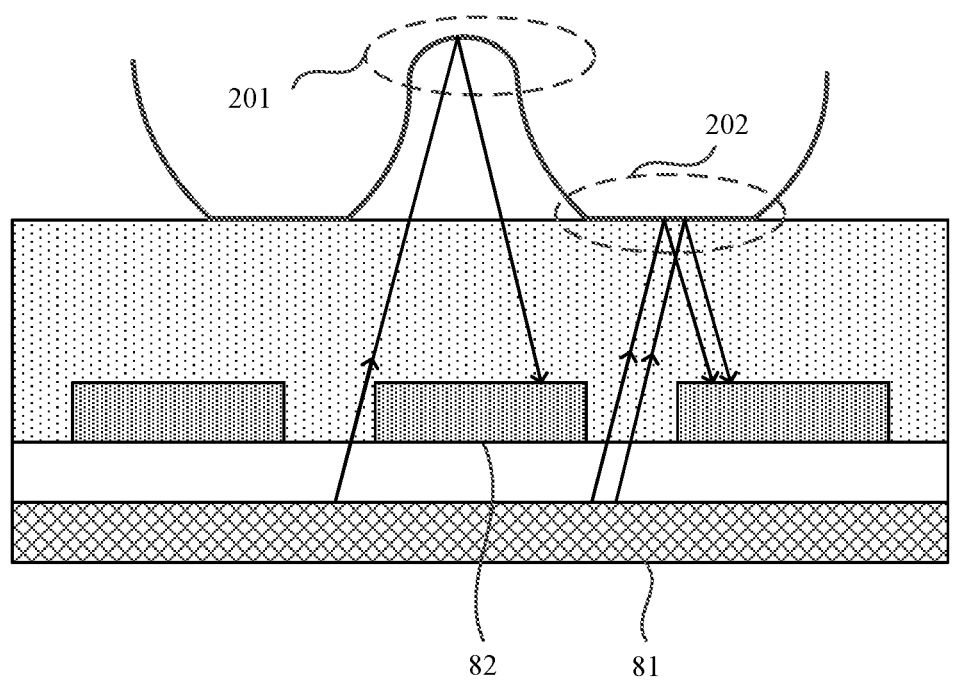
FIG. 11 is a schematic cross sectional view of a fingerprint recognition module according to an embodiment of the present disclosure.

FIG. 11 is a schematic structural view of a fingerprint recognition module according to an embodiment of the present disclosure. As shown in FIG. 11, the fingerprint recognition module includes a light-emitting unit 81 and a fingerprint recognition unit 82. The light-emitting unit 81 is configured to provide a light source for the fingerprint recognition unit 82. The light emitted by the light-emitting unit 81 is reflected by a touch body (such as a finger) to generate a reflection light, and then the reflection light is incident to the fingerprint recognition unit 82 for fingerprint recognition.

The skin texture of each person including the fingerprints is different from that of other person in pattern, breakpoints and intersections, and is unique and unchanged for a life. Accordingly, a person may be matched with his fingerprints to authenticate his true identity by comparing his fingerprints with pre-stored fingerprinting data.

Continued to refer to FIG. 11, when the user presses his finger against the surface of the fingerprint recognition module, the light emitted from a back light source 81 in the fingerprint recognition module is incident to the finger and reflected by the surface of the fingerprint of the finger to form the reflection light.

The finger fingerprint includes valleys 201 and ridges 202. The ridges 202 of the fingerprint of the finger pressed against the surface of the fingerprint recognition module are in contact with the surface of the fingerprint recognition module, while the valleys 201 are not in contact with the surface of the fingerprint recognition module, so the reflectivity when the light is incident to the valleys 201 of the fingerprint is different from the reflectivity when the light is incident to the ridges 202 of the fingerprint. Accordingly, the intensity of the reflection light formed at the ridges 202 and received by the fingerprint recognition unit 82 is different from the intensity of the reflection light formed at the valleys 201 and received by the fingerprint recognition unit 82, such that the magnitude of the current signal converted by a photosensitive resistor in the fingerprint recognition unit 82 from the reflection light formed at the ridges 202 is different from the magnitude of the current signal converted by the photosensitive resistor in the fingerprint recognition unit 82 from the reflection light formed at the valleys 201. The fingerprint recognition unit 82 may perform the fingerprint recognition based on the magnitudes of the current signals.

It should be noted that the above is only the optional embodiments of the present disclosure and the applied technical principles. Those skilled in the art should understand that the present disclosure is not limited to the specific embodiments described herein, and various apparent modification, readjustments, combinations and substitutions can be made by those skilled in the art without departing from the scope of the present disclosure. Therefore, although the present disclosure has been described in detail by way of the above embodiments, the present disclosure is not limited only to the above embodiments, and may include more other equivalent embodiments without departing from the concept of the present disclosure. However, the scope of the present disclosure is determined by the scope of the appended claims.

What is claimed is:

1. A flexible display device, comprising:
   a housing, wherein a sidewall of the housing is provided with an opening;
   a closure lid mated with the opening, wherein a surface of the closure lid facing away from the opening is provided with a user identity recognition module;
   a flexible display panel provided in an interior of the housing and configured to be wrapped around a shaft, wherein the flexible display panel comprises a first end and a second end opposite to the first end, wherein the first end is connected to the shaft, the second end is connected to the closure lid, when the flexible display panel does not extend out of the housing, the closure lid is engaged in the opening and seals the opening;
   an extension mechanism comprising a third end and a fourth end opposite to the third end, wherein the third end is secured to the sidewall of the housing, the fourth end is secured to the closure lid, the extension mechanism extends through the opening and is configured to support the flexible display panel when the flexible display panel extends out of the housing;
   a controller integrated to the sidewall of the housing and electrically connected to the user identity recognition module and the extension mechanism, wherein the controller is configured to control the extension mechanism and the flexible display panel to extend out of the housing according to an identity recognition signal detected by the user identity recognition module; and
   a flexible printed circuit;
   wherein the extension mechanism comprises a driving portion, a transmission portion and a support structure, wherein the support structure comprises at least one support frame comprising a plurality of support rods which are connected end to end, and two adjacent ones of the plurality of support rods are hinged with each other; and
   wherein the flexible printed circuit is wound around each of the plurality of support rods like a vine.

2. The flexible display device according to claim 1, further comprising: a displacement sensor integrated to the sidewall of the housing and configured to detect a relative displacement of the flexible display panel,
   wherein the controller is electrically connected to the displacement sensor and configured to measure a length of the flexible display panel extending out of the housing and an extended length of the extension mechanism.

3. The flexible display device according to claim 2, wherein the controller is configured to determine a size of an image when the image is displayed by the flexible display panel according to the length of the flexible display panel extending out of the housing.

4. The flexible display device according to claim 2, wherein the flexible display panel is provided with position marks,
   wherein the displacement sensor is configured to measure the length of the flexible display panel extending out of the housing and the extended length of the extension mechanism by detecting the position marks of the flexible display panel.

5. The flexible display device according to claim 1, wherein the flexible display panel comprises a display region and a non-display region surrounding the display region,
   wherein the display region and the non-display region have boundaries between thereof, wherein a distance between the first end of the flexible display panel and one of the boundaries closest to the first end of the flexible display panel is greater than a distance between the shaft and the opening.

6. The flexible display device according to claim 1,
   wherein the flexible printed circuit comprises a fifth end and a sixth end opposite to the fifth end, the fifth end of the flexible printed circuit is electrically connected to the user identity recognition module, and the sixth end of the flexible printed circuit is electrically connected to the controller.

7. The flexible display device according to claim 1,
   wherein the controller is connected to the driving portion and the transmission portion, and the driving portion drives, under the control of the controller, the transmission portion to perform transmission;
   wherein the transmission portion is connected to the support structure so as to drive the support structure to extend or retract.

8. The flexible display device according to claim 7,
   wherein the driving portion comprises a motor;
   wherein the transmission portion comprises a drum and a second rotation shaft;
   wherein the motor is connected to the second rotation shaft, the second rotation shaft is disposed at an axis of the drum and is secured to the drum, the support structure is wound on an outer surface of the drum to control the second rotation shaft to rotate around an axis thereof, such that the support structure is driven to extend or retract.

9. The flexible display device according to claim 1, wherein the support structure comprises one support frame and the support frame is in a zigzag shape.

10. The flexible display device according to claim 1, wherein the support structure comprises two support frames each in a zigzag shape, and two adjacent support frames are provided with a first rotation shaft at an overlapping region of the two adjacent support frames, and the support rods passing through the first rotation shafts are sleeved on the first rotation shafts.

11. The flexible display device according to claim 1, wherein the user identity recognition module comprises at least one of a face recognition module, an iris recognition module and a fingerprint recognition module.

12. The flexible display device according to claim 11, wherein the fingerprint recognition module comprises a light-emitting unit and a fingerprint recognition unit, wherein the light-emitting unit is configured to provide a light source for the fingerprint recognition unit, and wherein a light emitted by the light-emitting unit is reflected by a touch body to generate a reflection light, and then the reflection light is incident to the fingerprint recognition unit for fingerprint recognition.

13. A flexible display device, comprising:
a housing provided with an opening;
a closure lid mated with the opening;
a flexible display panel configured to be wrapped around a shaft in the housing, wherein a first end of the flexible display panel is connected to the shaft, and a second end of the flexible display panel is connected to the closure lid;
an extension mechanism comprising a third end and a fourth end opposite to the third end, wherein the third end is secured to the sidewall of the housing, the fourth end is secured to the closure lid, the extension mechanism extends through the opening and is configured to support the flexible display panel when the flexible display panel extends out of the housing; and
a controller in the housing and electrically connected to a user identity recognition module and the extension mechanism;
wherein the extension mechanism comprises a first support frame and a second support frame, each of the first support frame and the second support frame comprises a plurality of support rods which are connected end to end, wherein the first support frame and the second support frame are connected via a first rotation shaft at an overlapping region of the first support frame and the second support frame, and
wherein the extension mechanism further comprises a motor, a third rotation shaft, a belt, a spring, a transmission rod, wherein the motor is configured to drive the third rotation shaft to rotate, a first end of the belt is wound on the third rotation shaft and a second end of the belt is connected to a first end of the transmission rod, and a second end of the transmission rod is connected to one of the first support frame and the second support frame.

14. The flexible display device according to claim 13, further comprising a securing column, wherein the securing column passes through a groove of the transmission rod and is configured to define a movable range of the transmission rod.

15. The flexible display device according to claim 13, wherein a first end of the spring is secured to an inner sidewall of the housing, and a second end of the spring is connected to the second end of the belt, wherein the spring is configured to keep the belt in a direction perpendicular to an extension direction of the flexible display panel.

* * * * *